United States Patent
Akiyama et al.

(10) Patent No.: US 11,195,987 B2
(45) Date of Patent: Dec. 7, 2021

(54) METHOD FOR PRODUCING COMPOSITE WAFER HAVING OXIDE SINGLE-CRYSTAL FILM

(71) Applicant: SHIN-ETSU CHEMICAL CO., LTD., Tokyo (JP)

(72) Inventors: Shoji Akiyama, Annaka (JP); Makoto Kawai, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 197 days.

(21) Appl. No.: 15/577,405

(22) PCT Filed: Jun. 1, 2016

(86) PCT No.: PCT/JP2016/066281
§ 371 (c)(1),
(2) Date: Nov. 28, 2017

(87) PCT Pub. No.: WO2016/194975
PCT Pub. Date: Dec. 8, 2016

(65) Prior Publication Data
US 2018/0175283 A1 Jun. 21, 2018

(30) Foreign Application Priority Data
Jun. 2, 2015 (JP) .............................. JP2015-112331

(51) Int. Cl.
*B32B 17/06* (2006.01)
*H01L 41/312* (2013.01)
(Continued)

(52) U.S. Cl.
CPC ............ *H01L 41/312* (2013.01); *B32B 9/005* (2013.01); *B32B 17/06* (2013.01); *B32B 18/00* (2013.01);
(Continued)

(58) Field of Classification Search
CPC . H01L 41/312; H01L 21/02; H01L 21/76254; H01L 41/1873; H01L 41/338;
(Continued)

(56) References Cited

U.S. PATENT DOCUMENTS 4,371,419 A  2/1983  Fukuda et al.
5,374,564 A  12/1994  Bruel
(Continued)

FOREIGN PATENT DOCUMENTS

CN  101290872 A  10/2008
CN  102210007 A  10/2011
(Continued)

OTHER PUBLICATIONS

Jul. 19, 2016 Search Report issued in International Patent Application No. PCT/JP2016/066282.
(Continued)

*Primary Examiner* — Jonathan C Langman
(74) *Attorney, Agent, or Firm* — Oliff PLC

(57) ABSTRACT

A composite wafer having an oxide single-crystal film transferred onto a support wafer, the film being a lithium tantalate or lithium niobate film, and the composite wafer being unlikely to have cracking or peeling caused in the lamination interface between the film and the support wafer. More specifically, a method of producing the composite wafer, including steps of: implanting hydrogen atom ions or molecule ions from a surface of the oxide wafer to form an ion-implanted layer inside thereof; subjecting at least one of the surface of the oxide wafer and a surface of the support wafer to surface activation treatment; bonding the surfaces together to obtain a laminate; heat-treating the laminate at 90° C. or higher at which cracking is not caused; and exposing the heat-treated laminate to visible light to split along the ion-implanted layer to obtain the composite wafer.

7 Claims, 2 Drawing Sheets

(51) Int. Cl.
| | |
|---|---|
| H01L 21/02 | (2006.01) |
| H01L 21/265 | (2006.01) |
| B32B 9/00 | (2006.01) |
| B32B 18/00 | (2006.01) |
| B32B 37/18 | (2006.01) |
| B32B 38/00 | (2006.01) |
| B32B 38/10 | (2006.01) |
| C01G 33/00 | (2006.01) |
| C01G 35/00 | (2006.01) |
| C30B 29/30 | (2006.01) |
| C30B 31/22 | (2006.01) |
| H01L 21/762 | (2006.01) |
| H01L 41/187 | (2006.01) |
| H01L 41/338 | (2013.01) |

(52) U.S. Cl.
CPC .......... *B32B 37/18* (2013.01); *B32B 38/0036* (2013.01); *B32B 38/10* (2013.01); *C01G 33/006* (2013.01); *C01G 35/006* (2013.01); *C30B 29/30* (2013.01); *C30B 31/22* (2013.01); *H01L 21/02* (2013.01); *H01L 21/265* (2013.01); *H01L 21/76254* (2013.01); *H01L 41/1873* (2013.01); *H01L 41/338* (2013.01); *B32B 2250/02* (2013.01); *B32B 2260/02* (2013.01); *B32B 2260/04* (2013.01); *B32B 2307/20* (2013.01); *B32B 2310/0806* (2013.01); *B32B 2311/00* (2013.01); *B32B 2313/00* (2013.01); *B32B 2315/08* (2013.01); *B32B 2457/00* (2013.01)

(58) Field of Classification Search
CPC ............. H01L 21/265; H01L 21/02403; H01L 21/02598; H01L 21/02694; H01L 21/187; H01L 21/324; B32B 9/005; B32B 17/06; B32B 18/00; B32B 37/18; B32B 38/0036; B32B 38/10; B32B 2250/02; B32B 2260/02; B32B 2260/04; B32B 2307/20; B32B 2310/0806; B32B 2311/00; B32B 2313/00; B32B 2315/08; B32B 2457/00; C01G 33/006; C01G 35/006; C30B 29/30; C30B 31/22
See application file for complete search history.

(56) References Cited

U.S. PATENT DOCUMENTS

| | | | |
|---|---|---|---|
| 5,526,448 A | 6/1996 | Nagata et al. | |
| 5,668,057 A | 9/1997 | Eda et al. | |
| 5,910,699 A | 6/1999 | Namba et al. | |
| 6,319,430 B1 | 11/2001 | Bordui et al. | |
| 6,348,094 B1 | 2/2002 | Shiono et al. | |
| 6,540,827 B1 | 4/2003 | Levy et al. | |
| 6,803,028 B2 | 10/2004 | Gadkaree et al. | |
| 7,323,050 B2 | 1/2008 | Shiono | |
| 7,763,502 B2 | 7/2010 | Kakehata et al. | |
| 7,867,873 B2 | 1/2011 | Murakami et al. | |
| 8,748,294 B2 | 6/2014 | Akiyama | |
| 9,837,301 B2 | 12/2017 | Konishi et al. | |
| 10,095,057 B2 | 10/2018 | Iwamoto et al. | |
| 2002/0102777 A1 | 8/2002 | Sakaguchi et al. | |
| 2003/0056718 A1 | 3/2003 | Kawahara et al. | |
| 2005/0066879 A1 | 3/2005 | Shiono | |
| 2008/0261381 A1 | 10/2008 | Akiyama et al. | |
| 2010/0088868 A1* | 4/2010 | Kando | H01L 41/257 29/25.35 |
| 2010/0107388 A1 | 5/2010 | Iwamoto | |
| 2011/0227068 A1* | 9/2011 | Akiyama | H01L 21/76254 257/43 |
| 2011/0244655 A1 | 10/2011 | Akiyama et al. | |
| 2012/0247686 A1 | 10/2012 | Stefanescu | |
| 2012/0280355 A1 | 11/2012 | Akiyama | |
| 2013/0072009 A1* | 3/2013 | Bruel | H01L 21/762 438/530 |
| 2015/0200129 A1 | 7/2015 | Konishi et al. | |
| 2016/0056068 A1 | 2/2016 | Hu et al. | |

FOREIGN PATENT DOCUMENTS

| | | | |
|---|---|---|---|
| CN | 104078407 A | | 10/2014 |
| EP | 1 401 022 A1 | | 3/2004 |
| EP | 1 986 218 A1 | | 10/2008 |
| JP | H11-163363 A | | 6/1999 |
| JP | 3048201 B2 | | 6/2000 |
| JP | 2002-231912 A | | 8/2002 |
| JP | 2003-095798 A | | 4/2003 |
| JP | 2010-109949 A | | 5/2010 |
| JP | 2010-161359 A | | 7/2010 |
| JP | 2011-138932 A | | 7/2011 |
| JP | 2013-149853 A | | 8/2013 |
| JP | 2015-046486 A | | 3/2015 |
| WO | 2014/017369 A1 | | 1/2014 |
| WO | 2014/153923 A1 | | 10/2014 |

OTHER PUBLICATIONS

Jul. 19, 2016 Search Report issued in International Patent Application No. PCT/JP2016/066284.
Jul. 19, 2016 Search Report issued in International Patent Application No. PCT/JP2016/066283.
U.S. Appl. No. 15/577,456, filed Nov. 28, 2017 in the name of Akiyama et al.
U.S. Appl. No. 15/577,615, filed Nov. 28, 2017 in the name of Akiyama et al.
U.S. Appl. No. 15/577,683, filed Nov. 28, 2017 in the name of Akiyama et al.
Dec. 5, 2017 International Preliminary Report on Patentability issued in International Patent Application No. PCT/JP2016/066282.
Dec. 5, 2017 International Preliminary Report on Patentability issued in International Patent Application No. PCT/JP2016/066283.
Dec. 5, 2017 International Preliminary Report on Patentability issued in International Patent Application No. PCT/JP2016/066284.
Dec. 20, 2018 Extended Search Report issued in European Patent Application No. 16803409.8.
Dec. 20, 2018 Extended Search Report issued in European Patent Application No. 16803411.4.
Dec. 20, 2018 Extended Search Report issued in European Patent Application No. 16803412.2.
Dec. 5, 2017 International Preliminary Report on Patentability issued in International Patent Application No. PCT/JP2016/066281.
Taiyo Yuden Co., Ltd., "Temperature compensation technology for SAW-Duplexer used in RF front end of smartphone", Dempa Shimbun High Technology, 2012.
A Tauzin et al., "3-inch single-crystal LiTaO3 films onto metallic electrode using Smart CutTM technology", Electric Letters, vol. 44, No. 13, pp. 822-824, 2008.
Weill Liu et al., "Fabrication of single-crystalline LiTaO3 film on silicon substrate using thin film transfer technology", J. Vac. Sci. Technol., pp. 206-208, 2008.
Jul. 19, 2016 International Search Report issued in International Patent Application No. PCT/JP2016/066281.
Nov. 9, 2018 Extended European Search Report issued in European Patent Application No. 16803410.6.
Henttinen, K., et al. "Mechanically induced Si layer transfer in hydrogen-implanted Si wafers". Applied Physics Letters, vol. 76, No. 17, pp. 2370-2372, 2000.
Oct. 2, 2019 Office Action issued in U.S. Appl. No. 15/577,683.
Oct. 2, 2019 Office Action issued in U.S. Appl. No. 15/577,456.
Oct. 3, 2019 Office Action issued in U.S. Appl. No. 15/577,615.
Jul. 9, 2020 Office Action Issued in U.S. Appl. No. 15/577,683.
Dec. 2, 2020 Office Action issued in Chinese Patent Application No. 201680031978.1.

* cited by examiner

METHOD FOR PRODUCING COMPOSITE WAFER HAVING OXIDE SINGLE-CRYSTAL FILM

TECHNICAL FIELD

The invention relates to a method of producing a composite wafer. More specifically, the invention relates to a method of producing a composite wafer having an oxide single-crystal film on a support wafer.

BACKGROUND ART

In the field of mobile communication devices typified by smartphones, a drastic increase in communication traffic and multi-functionality have recently progressed. In order to meet the increase in communication traffic, the number of bands has been increased, while the mobile communication devices are required to have various functions without enlarging the shape of them. Various parts to be used for these mobile communication devices must therefore be smaller and have higher performance.

An oxide single crystal such as lithium tantalate (LT) and lithium niobate (LN) is a typical piezoelectric material and has been used widely as a material of surface acoustic wave (SAW) devices. The oxide single crystal used as a piezoelectric material enables band broadening because an electromechanical coupling factor, which indicates the conversion efficiency of electromagnetic energy into dynamic energy, is large. However, it has low stability against a temperature change, and the frequency to which it can respond varies with the temperature change. The low stability against the temperature change owes to the thermal expansion coefficient of the oxide single crystal.

For improving the temperature stability in the case where the oxide single crystal is used as a piezoelectric material, there is provided, for example, a method comprising steps of: laminating, with an oxide single-crystal wafer, a material having a thermal expansion coefficient smaller than that of the oxide single crystal, more specifically, a sapphire wafer; and thinning (e.g. grinding) the oxide single-crystal wafer side of the resulting laminate to a thickness of from several to tens of μm to suppress the influence of thermal expansion of the oxide single crystal (Non-Patent Document 1). In this method, however, the oxide single-crystal wafer is ground after lamination, so that a large portion of the oxide single-crystal wafer is wasted. Thus, it is inferior in terms of efficient use of the material. In addition, lithium tantalate or lithium niobate used as the oxide single crystal is an expensive material so that there is a demand for a method involving highly efficient use of the material and being capable of reducing the waste so as to reduce a production cost.

As an example of the method of producing a SOI wafer, the Small-Cut method, in short, comprises steps of: laminating a silicon wafer having a hydrogen ion-implanted layer with a support wafer, and heat-treating the resulting laminate around 500° C. to thermally split the laminate along the ion-implanted layer (Patent Document 1). In order to enhance the efficient use of an oxide single-crystal wafer, an attempt has been made to use the oxide single-crystal wafer instead of the silicon wafer used in the Small-Cut method to form an oxide single-crystal film on the support wafer (Non-Patent Documents 2 and 3).

Non-Patent Document 2 reports a method of producing a LTMOI (lithium-tantalate-metal-on-insulator) structure comprising steps of: forming a 121-nm thick Cr metal layer on a surface of a lithium tantalate wafer having an ion-implanted layer; laminating the wafer with a $SiO_2$ substrate having a thickness of hundreds of nm, while keeping the metal layer therebetween; heat-treating the resulting laminate at a temperature of from 200 to 500° C. to split the laminate along the ion-implanted layer, thereby transferring a lithium tantalate film onto the $SiO_2$ substrate via the metal layer; and laminating the lithium tantalate wafer with the surface of the $SiO_2$ substrate on the side opposite to the surface to which the lithium tantalate film has been transferred. Non-Patent Document 3 reports a method of thermally transferring a lithium tantalate film onto the silicon wafer comprising steps of: laminating a silicon wafer with a lithium tantalate wafer having an ion-implanted layer; and heat-treating the resulting laminate at 200° C. to split the laminate along the ion-implanted layer.

PRIOR ART DOCUMENT

Patent Document

[Patent Document 1] Japanese Patent No. 3048201

Non-Patent Documents

[Non-Patent Document 1] Taiyo Yuden Co., Ltd., "Temperature compensation technology for SAW-Duplexer used in RF front end of smartphone", [online], Nov. 8, 2012, Dempa Shimbun High Technology, [searched on Mar. 20, 2015], internet (URL: http://www.yuden.co.jp/jp/product/tech/column/20121108.html)

[Non-Patent Document 2] A Tauzin et al., "3-inch single-crystal $LiTaO_3$ films onto metallic electrode using Smart Cut™ technology", Electric Letters, 19 Jun. 2008, Vol. 44, No. 13, p. 822

[Non-Patent Document 3] Weill Liu et al., "Fabrication of single-crystalline $LiTaO_3$ film on silicon substrate using thin film transfer technology", J. Vac. Sci. Technol. B26 (1), January/February 2008, p. 206

SUMMARY OF THE INVENTION

Problem to be Solved by the Invention

An oxide single crystal such as lithium tantalate (LT) and lithium niobate (LN) is hard and very fragile. In addition, it has a markedly large thermal expansion coefficient compared with those of silicon, glass and sapphire as shown in FIG. 2. The oxide single crystal therefore has such a drawback that heat-treating at a high temperature after lamination with a different kind of wafer such as a silicon, glass or sapphire wafer may cause peeling or cracking between the wafers thus laminated due to a difference in thermal expansion coefficient. For example, a difference in thermal expansion coefficient between lithium tantalate and sapphire, which is typically used as a support wafer and has a particularly large thermal expansion coefficient, is as large as $7 \times 10^{-6}/K$ (=7 ppm/K) or more, as can be confirmed from FIG. 2.

According to the Non-Patent Document 2, by selecting the structure of interposing the metal layer and the $SiO_2$ substrate between the lithium tantalate wafer and the lithium tantalate film, the lithium tantalate film can be transferred, while suppressing peeling or cracking of the wafer attributable to the difference in thermal expansion during the heat treatment. In this method, however, an underlying substrate is made of lithium tantalite, which is a material also used for the film, so that poor temperature stability, which is the above-described problem of a piezoelectric material, cannot be improved. In addition, the film cannot be transferred unless heat-treated at 200° C. or higher. Further, the structure of interposing the metal layer narrows the range of applications. Still further, expensive lithium tantalate must be used excessively for suppressing cracking of the wafer, leading to an increase in a production cost.

Non-Patent Document 3 describes heat treatment at a temperature of from 200 to 800° C. However, heat treatment only at 200° C. was carried out in an example of transferring the lithium tantalate film onto the silicon wafer by the Smart-Cut method. In this example, there is no description on whether or not the lithium tantalate film was transferred onto the entire surface of the silicon wafer. The present inventors have carried out a verification test on splitting during the heat treatment at 200° C. by using a method similar to that used in Non-Patent Document 3, and found that the lithium tantalate film was transferred onto not the entire surface of the silicon wafer but a small area of the surface. In particular, the lithium tantalate film was not transferred at all at the peripheral area of the silicon wafer. This is presumed to occur because the wafers formed into the laminate were warped due to a difference in thermal expansion during the heat treatment, and peeling occurred along the lamination interface with the lithium tantalate wafer at the peripheral area of the silicon wafer. Even if the heat treatment is done at 200° C. or higher, it is impossible to prevent the warp of the wafers formed into the laminate due to the difference in thermal expansion and to stably transfer the lithium tantalate film onto the entire surface of the silicon wafer, as described above.

Solution to the Problem

The inventors have carried out an extensive investigation and have found a method of producing a low-cost composite wafer, comprising an oxide single-crystal film on a support wafer and being unlikely to peel or crack at the lamination interface, unexpectedly by selecting a support wafer material having a thermal expansion coefficient largely different from that of an oxide single crystal, specifically, by selecting a support wafer material having a thermal expansion coefficient of 7 ppm/K or more smaller than that of an oxide single crystal. This approach is different from the conventional approach of suppressing generation of a stress by using materials having thermal expansion coefficients close to each other. More specifically, the inventors have found a method in which an oxide single-crystal wafer having an ion-implanted layer formed using a predetermined hydrogen ion implantation dose and a support wafer having a thermal expansion coefficient smaller than that of the oxide single-crystal are laminated together, taking advantage of a bonding force between the wafers generated by surface activation treatment or the like; the resulting laminate is heat-treated at a temperature low enough not to cause thermal splitting; and then the ion-implanted layer of the laminate is exposed to high intensity of visible light to accelerate embrittlement of the ion-implanted layer for splitting, while controlling the temperature of the laminate to fall within a predetermined range of the difference from the temperature at the laminating.

In an aspect of the invention, there is provided a method of producing a composite wafer having an oxide single-crystal film on a support wafer, comprising steps of:

implanting hydrogen atom ions or hydrogen molecule ions into an oxide single-crystal wafer through a surface thereof, which wafer is a lithium tantalate or lithium niobate wafer, to form an ion-implanted layer inside the oxide single-crystal wafer;

subjecting at least one of the surface of the oxide single-crystal wafer and a surface of a support wafer to be laminated with the oxide single-crystal wafer to surface activation treatment;

after the surface activation treatment, bonding the surface of the oxide single-crystal wafer to the surface of the support wafer to obtain a laminate;

heat-treating the laminate at a temperature of 90° C. or higher at which cracking is not caused; and exposing the heat-treated laminate to visible light to split the laminate along the ion-implanted layer to obtain an oxide single-crystal film transferred onto the support wafer; wherein an implantation dose of the hydrogen atom ions is from $5.0 \times 10^{16}$ atom/cm$^2$ to $2.75 \times 10^{17}$ atom/cm$^2$ and an implantation dose of the hydrogen molecule ions is from $2.5 \times 10^{16}$ atoms/cm$^2$ to $1.37 \times 10^{17}$ atoms/cm$^2$;

the support wafer is selected from the group consisting of a sapphire wafer, a silicon wafer, a silicon wafer with an oxide film, and a glass wafer; and a difference between a temperature at the bonding to obtain the laminate and a temperature of the laminate at the exposition to the visible light is 90° C. or less in a case where the support wafer is the sapphire wafer; 80° C. or less in a case where the support wafer is the silicon wafer or the silicon wafer with an oxide film; and 40° C. or less in a case where the support wafer is the glass wafer.

Effect of the Invention

According to the invention, by using the production method, there can be provided a composite wafer having high adhesion at the lamination interface between the support wafer and the oxide single-crystal film, being unlikely to cause peeling or cracking, and having the oxide single-crystal film with a uniform thickness transferred onto the entire surface of the support wafer. The oxide single-crystal wafer separated through the transfer of the oxide single-crystal film onto the support wafer can be used again for the production of a composite wafer so that use of the production method can bring cost reduction.

MODE FOR CARRYING OUT THE INVENTION

Figure 1:
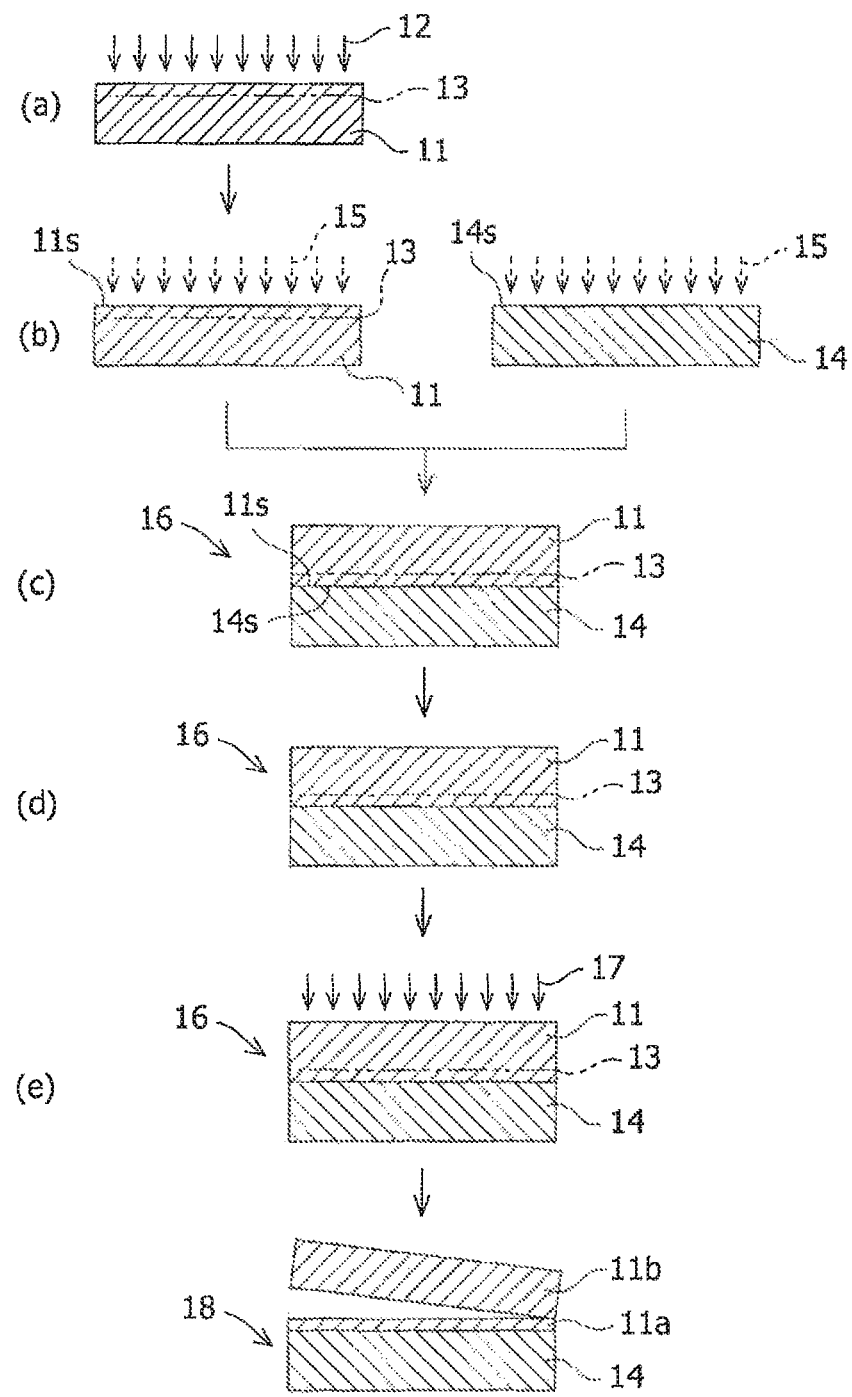
FIG. 1 is a schematic view of the method of producing a composite wafer in one of the embodiments of the invention.
Figure 2:
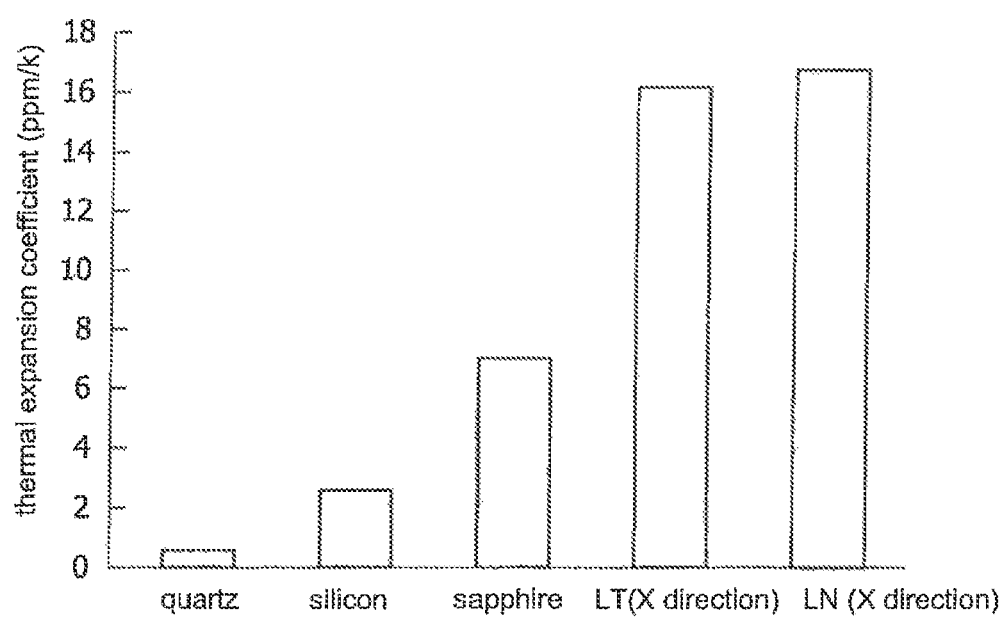
FIG. 2 shows comparison in thermal expansion coefficient among various materials.

Embodiments for carrying out the invention will hereinafter be described in detail, but the scope of the invention is not limited by them.

In one of the embodiments of the invention, there is provided a method of producing a composite wafer having an oxide single-crystal film on a support wafer.

The support wafer may be, for example, a wafer made of a material having a thermal expansion coefficient of at least 7 ppm/K smaller than that of the oxide single-crystal wafer to be laminated. Examples of the support wafer include a sapphire wafer, a silicon wafer, a silicon wafer with an oxide film, and a glass wafer. The size of the support wafer is not particular limited, and may be, for example, a wafer having a diameter of from 75 to 150 mm and a thickness of from 0.2 to 0.8 mm. The support wafer is not particularly limited, and a commercially available wafer may be used. For example, the silicon wafer with an oxide film is a silicon wafer having an oxide film formed at least on the surface to be laminated, wherein the oxide film may be formed on the surface of a silicon wafer by heat-treating the silicon wafer at 700 to 1200° C. in an air atmosphere. The thickness of the oxide film of the silicon wafer with an oxide film is not particularly limited, and is preferably from 10 to 500 nm.

The oxide single crystal is a compound made from lithium, a metal element such as tantalum or niobium, and oxygen. Examples of the oxide single crystal include lithium tantalate ($LiTaO_3$) and lithium niobate ($LiNbO_3$). The oxide single crystal is preferably a lithium tantalate single crystal or a lithium niobate single crystal particularly when it is used for a laser element, a piezoelectric element, a surface acoustic wave element or the like. The oxide single crystal is typically used in the form of a wafer. The size of the oxide single-crystal wafer is not particularly limited, and may have, for example, a diameter of from 75 to 150 mm and a thickness of from 0.2 to 0.8 mm. The oxide single-crystal wafer may be selected from commercially available wafers, or may be produced by using one of known methods (for example, JP 2003-165795A, and JP 2004-079061T which is the national phase publication of PCT application) including the Czochralski process, or may be produced in combination of the steps contained by the known methods.

Each of the support wafer and the oxide single-crystal wafer preferably has a surface roughness RMS of 1.0 nm or less at the surface to be bonded together. The surface roughness RMS of more than 1.0 nm may generate a gap at the lamination interface and the gap may cause peeling. A wafer having a surface roughness RMS of more than 1.0 nm may be subjected to chemical mechanical polishing (CMP) to have the desired surface roughness. The surface roughness RMS may be evaluated, for example, by atomic force microscopy (AFM).

Hydrogen ions are implanted into the oxide single-crystal wafer through a surface thereof to form an ion-implanted layer inside the oxide single-crystal wafer. The ion-implanted layer is formed by implanting a predetermined dose of hydrogen atom ions ($H^+$) or hydrogen molecule ions ($H_2^+$) with an implantation energy enough to form an ion-implanted layer at a desired depth from the surface of the oxide single-crystal wafer. The implantation energy may be, for example, from 50 to 200 keV in this implantation. The implantation dose of hydrogen atom ions ($H^+$) is from $5.0 \times 10^{16}$ atom/cm$^2$ to $2.75 \times 10^{17}$ atom/cm$^2$. The implantation dose of less than $5.0 \times 10^{16}$ atom/cm$^2$ does not cause embrittlement of the ion-implanted layer in a later step. The implantation dose of more than $2.75 \times 10^{17}$ atom/cm$^2$ generates microcavities in the surface from which the ions have been implanted, so that the wafer having a desired surface roughness cannot be obtained because of the unevenness in the wafer surface. The implantation dose of hydrogen molecule ions ($H_2^+$) is from $2.5 \times 10^{16}$ atoms/cm$^2$ to $1.37 \times 10^{17}$ atoms/cm$^2$. The implantation dose of less than $2.5 \times 10^{16}$ atoms/cm$^2$ does not cause embrittlement of the ion-implanted layer in a later step. The implantation dose of more than $1.37 \times 10^{17}$ atoms/cm$^2$ generates microcavities in the surface from which the ions have been implanted, so that the wafer from having a desired surface roughness cannot be obtained because of the unevenness in the wafer surface. The implantation dose of hydrogen atom ions may be twice the dose of hydrogen molecule ions.

Next, at least one of the surface of the oxide single-crystal wafer from which the ions have been implanted and the surface of the support wafer to be laminated with the oxide single-crystal wafer is subjected to surface activation treatment. Both of the surface of the oxide single-crystal wafer from which the ions have been implanted and the surface of the support wafer to be laminated with the oxide single-crystal wafer may be subjected to surface activation treatment. At least one of the surfaces is required to be subjected to surface activation treatment. As a result of the surface activation treatment, the desired degree of a bond strength can be obtained even at relatively low temperature of the heat treatment after the step of bonding (i.e. laminating) without requiring high temperature heat treatment to enhance a bond strength. Particularly when a hard and fragile oxide single-crystal wafer such as a lithium tantalate or lithium niobate wafer and a support wafer having a thermal expansion coefficient of much smaller than that of the oxide single-crystal wafer are laminated together after the surface activation treatment as described above, a large shear stress generated in parallel with the lamination interface due to a difference in thermal expansion coefficient between the oxide single-crystal wafer and the support wafer at a relatively low temperature in the later step may accelerate fracture not at the lamination interface provided with a bond strength enough to compete with the shear stress by the surface activation treatment but at the ion-implanted layer to the degree of not causing splitting.

Examples of the surface activation treatment include ozone water treatment, UV ozone treatment, ion beam treatment, and plasma treatment. When the ozone water treatment is selected, the surface can be activated with active ozone, for example, by introducing an ozone gas into pure water to obtain ozone water, and immersing the wafer in the resulting ozone water. When UV ozone treatment is selected, the surface can be activated, for example, by retaining the wafer in an atmosphere in which active ozone has been generated by irradiating the air or an oxygen gas with short-wavelength UV light (having, for example, a wavelength of about 195 nm). When ion beam treatment is selected, the surface can be activated, for example, by applying an ion beam such as Ar to the wafer surface in high vacuum (e.g. less than $1 \times 10^{-5}$ Pa) to allow highly active dangling bonds to be exposed on the surface. When plasma treatment is selected, the surface is treated with plasma, for example, by exposing the wafer placed in a vacuum chamber to a plasma gas under reduced pressure (for example, from 0.2 to 1.0 mTorr) for about 5 to 60 seconds. As the plasma gas, an oxygen gas is used for oxidizing the surface, while a hydrogen gas, a nitrogen gas, an argon gas, or a mixture thereof may be used for not oxidizing the surface. When the wafer surface is treated with plasma, organic matters thereon are removed by oxidation and further, the wafer surface is activated because of the increased number of OH groups on the surface.

After the surface activation treatment, the surface of the oxide single-crystal wafer from which the ions have been implanted is bonded to the surface of the support wafer to obtain a laminate. The oxide single-crystal wafer and the support wafer are laminated together preferably at a temperature in the vicinity of room temperature (including the room temperature), for example, from 10 to 50° C. The composite wafer as a product is often used around room temperature so that the temperature at the bonding (i.e. laminating) is desirably based on this temperature range. The temperature at the bonding may be a temperature of the location where the step of bonding takes place, that is, an ambient temperature or an atmospheric temperature in an apparatus. The temperature at the bonding (i.e. laminating) may be controlled, for example, by selecting the atmospheric temperature in a lamination apparatus. The term "room temperature" means an ambient temperature measured without heating or cooling an object. The room temperature is not particularly limited, and is, for example, from 10 to 30° C., preferably around 25° C.

Next, the laminate is heat-treated at a temperature of 90° C. or higher and, for example, at the temperature of not causing cracks at the lamination interface. The heat treatment at a temperature of lower than 90° C. may cause peeling at the lamination interface because the bond strength at the lamination interface between the oxide single-crystal wafer and the support wafer is insufficient. The temperature of the heat treatment may be changed in accordance with the support wafer to be used. For example, when the support wafer is a sapphire wafer, the temperature in the step of heat-treating is preferably from 90 to 225° C., more preferably from 90 to 200° C. When the support wafer is a silicon wafer or a silicon wafer with an oxide film, the temperature is preferably from 90 to 200° C., more preferably from 90 to 175° C. When the support wafer is a glass wafer, the temperature is preferably from 90 to 110° C., more preferably from 90 to 100° C. Heat-treating the laminate at a temperature of 90° C. or higher and of not causing a crack makes it possible not only to improve a bonding force at the lamination interface between the support wafer and the oxide single-crystal wafer but also to facilitate embrittlement of the ion-implanted layer in a later step. Examples of a heater include, but not particularly limited to, a heat treatment furnace and an oven. As the temperature of the laminate, the atmospheric temperature in the furnace or oven, which is measured, for example, by using a thermocouple placed therein, may be used. The heat treatment time at the above-described temperature is not particularly limited unless cracking or peeling takes place at the lamination interface or the like. The heat treatment time may be from 10 minutes to tens of hours, for example, up to 100 hours. For example, when the heat treatment temperature is 90° C. or more and less than 110° C., the heat treatment time of from 10 minutes to 100 hours is preferred. When the heat treatment temperature is 110° C. or more and less than 175° C., the heat treatment time of from 10 minutes to 60 hours is preferred. When the heat treatment temperature is 175° C. or more and less than 200° C., the heat treatment time of from 10 minutes to 24 hours is preferred. When the heat treatment temperature is 200° C. or more and less than 225° C., the heat treatment time of from 10 minutes to 12 hours is preferred. In the invention, the step of heat-treating can be simplified because the laminate can be heat-treated without providing the laminate with a protection wafer.

The heat-treated laminate is preferably cooled to a temperature in the vicinity of room temperature (including the room temperature), for example, from 10 to 50° C. For example, the heat-treated laminate may be allowed to stand in a room controlled to 25° C. to obtain the laminate of a desired temperature. Cooling the laminate to a temperature in the vicinity of room temperature similar to the temperature at the bonding (i.e. laminating) to obtain the laminate can reduce a stress to be applied to the laminate so that a crack or defect is not likely to be generated in the laminate in the later step of exposing the laminate to visible light to split the laminate.

Next, the heat-treated laminate is exposed to visible light to split the laminate along the ion-implanted layer so that an oxide single-crystal film is transferred onto the support wafer. Examples of a source of the visible light include a laser light source and a flash lamp of a flash lamp annealer. The light source is preferably a light source of Rapid Thermal Annnealer (RTA), a green laser light source, or a flash lamp. By the mechanism in which due to amorphization in the vicinity of the ion-implanted interface formed inside the oxide single-crystal wafer, the ion-implanted layer easily absorbs a visible light and selectively accepts energy, the ion-implanted layer can be embrittled for splitting. The laminate can be split by making use of the phenomenon that the ion-implanted oxide single crystal becomes dark in color, that is, the phenomenon that the ion-implanted layer, which is a portion damaged by ion implantation, has an increased light absorption coefficient.

The laminate is preferably exposed to visible light from the oxide single-crystal wafer side. When the support wafer is a sapphire wafer or a glass wafer, the laminate may be exposed to visible light from the oxide single-crystal wafer side or the support wafer side. Since the sapphire wafer or the glass wafer is transparent, the visible light can reach even the ion-implanted layer in the oxide single-crystal wafer without being absorbed, and can embrittle the ion-implanted layer.

The laminate may be exposed to visible light, while not being heated or cooled, or while being heated or cooled. The laminate is exposed to the visible light, while controlling the temperature of the laminate to a predetermined temperature. When the temperature is higher than the predetermined temperature, peeling or cracking may take place at the lamination interface. The term "predetermined temperature" of the laminate embraces a temperature similar to the temperature at the bonding (i.e. laminating), that is, a temperature in the vicinity of room temperature (including the room temperature), for example, from about 10 to 50° C. Such a temperature is desired because it can reduce the stress of the laminate and make it unlikely to cause a crack or defect in the laminate. The predetermined temperature may be changed depending on the kind of the support wafer to be used. Provided that the temperature at the bonding (i.e. laminating) is, for example, 25° C., when the support wafer is a sapphire wafer, the predetermined temperature is preferably from the vicinity of room temperature, such as 20° C., to less than 115° C. When the support wafer is a silicon wafer or a silicon wafer with an oxide film, the predetermined temperature is preferably from the vicinity of room temperature, such as 20° C., to less than 105° C. When the support wafer is a glass wafer, the predetermined temperature is preferably from the vicinity of room temperature, such as 20° C., to less than 65° C. When the laminate is exposed to visible light at the predetermined temperature higher than the temperature in the vicinity of room temperature, the laminate may be exposed to the visible light, while heated at the predetermined temperature in a heat treatment furnace, in an oven, on a hot plate, or the like. As the temperature of the laminate during the exposition to the visible light, an atmospheric temperature such as an atmospheric temperature in a furnace or oven measured with a thermocouple placed therein, or a temperature of the surface of a hot plate directly measured with a thermometer equipped with a thermocouple may be used.

The temperature of the laminate during the exposition to visible light has a predetermined preferable temperature range with relation to the above-described temperature at the bonding (i.e. laminating) to obtain the laminate. For example, a difference between the temperature at the bonding (i.e. laminating) to obtain the laminate and the temperature of the laminate during the exposition to visible light is 90° C. or less in a case where the support wafer is a sapphire wafer; 80° C. or less in a case where the support wafer is a silicon wafer or a silicon wafer with an oxide film; and 40° C. or less in a case where the support wafer is a glass wafer. When the temperature of the laminate during the exposition to visible light is higher than the predetermined preferable range, peeling or cracking may be generated at the lamination interface of the laminate.

The step of exposing the laminate to visible light may optionally comprise exposing the laminate to visible light, while bringing a wedge-like blade into contact with or inserting a wedge-like blade into a side surface of the laminate, for example, an end portion of the ion-implanted layer, to split the laminate along the ion-implanted layer to obtain a composite wafer having an oxide single-crystal film transferred onto the support wafer. By using both of light energy produced by the exposition to light and physical energy produced by the mechanical impact, the laminate can be split more smoothly and at the same time, handling properties during the transfer can be improved.

By using the above-described method, a composite wafer comprising a support wafer, and an oxide single-crystal film, which is a lithium tantalate or lithium niobate film, on the support wafer can be obtained. The thickness of the oxide single-crystal film of the resulting composite wafer corresponds to the implantation depth of hydrogen ions during the hydrogen ion implantation and is preferably from 100 to 1000 nm. The surface of the oxide single-crystal film may be optionally ground.

According to the invention, the method of producing a composite wafer is not particularly limited, and one of the embodiments is shown in FIG. 1. Hydrogen ions 12 are implanted into an oxide single-crystal wafer 11 through a surface thereof to form an ion-implanted layer 13 inside the oxide single-crystal wafer 11 (in step a). The surface 11s of the oxide single-crystal wafer 11 from which the ions have been implanted and the surface 14s of a support wafer 14 to be laminated with the oxide single-crystal wafer are both subjected to surface activation treatment by exposing them to an ion beam 15 (in step b). After the surface activation treatment, the surface 11s of the oxide single-crystal wafer from which the ions have been implanted is bonded to the surface 14s of the support wafer to obtain a laminate 16 (in step c). The laminate 16 thus obtained is heat-treated at a temperature of 90° C. or higher (in step d). By exposing the heat-treated laminate 16 to visible light 17 from the oxide single-crystal wafer 11 side, the oxide single-crystal wafer can be split along the ion-implanted layer 13 to remove a portion 11b of the oxide single-crystal wafer and obtain a composite wafer 18 having an oxide single-crystal film 11a transferred onto the support wafer 14 (in step e). Although not shown, in the step e, a composite wafer having the oxide single-crystal film transferred onto a sapphire wafer may be obtained by exposing the heat-treated laminate to visible light from the sapphire wafer side to split the oxide single-crystal wafer along the ion-implanted layer and remove a portion of the oxide single-crystal wafer. Further, although not shown, in the step e, a composite wafer having an oxide single-crystal film transferred onto a support wafer may be obtained by exposing the laminate to visible light from the oxide single-crystal wafer side, while bringing a wedge-like blade into contact with an end portion of the ion-implanted layer of the heat-treated laminate, to split the oxide single-crystal wafer along the ion-implanted layer and remove a portion of the oxide single-crystal wafer.

EXAMPLES

Experiment 1

As a support wafer, a sapphire wafer having a diameter of 100 mm and a thickness of 0.35 mm was used. As an oxide single-crystal wafer, a lithium tantalate wafer having a diameter of 100 mm and a thickness of 0.35 mm was used. The surface roughness RMS of each surface of the sapphire wafer and the lithium tantalate wafer to be bonded together was determined using an atomic force microscope to be 1.0 nm or less.

The respective surfaces of the sapphire wafer and the lithium tantalate wafer to be bonded together were subjected to surface activation by plasma treatment with a plasma activation apparatus in a nitrogen atmosphere. Next, the surface-activated surfaces of the sapphire wafer and the lithium tantalate wafer were bonded together at room temperature (25° C.) to obtain a laminate. Each of the laminates thus obtained was heated to a temperature of 70, 80, 90, 100, 110, 125, 150, 175, 200, 225, 250, or 275° C. and heat-treated at the temperature for 24 hours. A heat treatment oven was used as a heat-treating unit, and the atmospheric temperature in the oven measured with a thermocouple was used as the temperature of the laminate. The result of appearance inspection of each laminate thus obtained is shown in Table 1. The appearance inspection was performed visually. The laminate without cracking or chipping was evaluated as "A", the laminate having fine cracking was evaluated as "B", and broken laminate was evaluated as "F". It is confirmed that the laminate samples obtained using a sapphire substrate as the support wafer and the heat treatment at 70 to 225° C. had neither cracking nor chipping.

Experiment 2

Laminates were obtained and heat-treated in the same manner as in Experiment 1 except that a silicon wafer having a diameter of 100 mm and a thickness of 0.35 mm was used as the support wafer, and each laminate thus obtained was heated to a temperature of 70, 80, 90, 100, 110, 125, 150, 175, 200, or 225° C. and heat-treated at the temperature for 24 hours. Each of the surface of the silicon wafer and the surface of the lithium tantalate wafer to be bonded together had a surface roughness RMS of 1.0 nm or less. The result of the appearance inspection of each laminate thus obtained is shown in Table 1. It is confirmed that the laminate samples obtained using a silicon wafer as the support wafer and the heat treatment at 0 to 200° C. had neither cracking nor chipping.

Experiment 3

Laminates were obtained and heat-treated in the same manner as in Experiment 1 except that a silicon wafer with an oxide film containing a silicon wafer having a diameter of 100 mm and a thickness of 0.35 mm and a 100-nm oxide film on the silicon wafer was used as the support wafer, and each laminate thus obtained was heated to a temperature of 70, 80, 90, 100, 110, 125, 150, 175, 200, or 225° C., and heat-treated at the temperature for 24 hours. Each of the surface of the silicon wafer with an oxide film and the surface of the lithium tantalate wafer to be bonded together had a surface roughness RMS of 1.0 nm or less. The result of the appearance inspection of each laminate thus obtained is shown in Table 1. The silicon wafer with an oxide film was obtained by heat-treating a silicon wafer at 11000° C. for about one hour to allow a 100-nm thermal oxide film to grow on the silicon wafer. It is confirmed that the laminate samples obtained using the silicon wafer with an oxide film as the support wafer and the heat treatment at 70 to 200° C. had neither cracking nor chipping.

Experiment 4

Laminates were obtained and heat-treated in the same manner as in Experiment 1 except that a glass wafer having a diameter of 100 mm and a thickness of 0.35 mm was used as the support wafer, and each laminate thus obtained was heated to a temperature of 70, 80, 90, 100, 110, or 125° C., and heat-treated at the temperature for 24 hours. Each of the surface of the glass wafer and the surface of the lithium tantalate wafer to be bonded together had a surface roughness RMS of 1.0 nm or less. The result of the appearance inspection of each laminate thus obtained is shown in Table 1. It is confirmed that the laminate samples obtained using a glass wafer as the support wafer and the heat treatment at 70 to 110° C. had neither cracking nor chipping.

TABLE 1

| kind of support wafer | temperature (° C.) of laminate during heat treatment | | | | | | | | | | | |
|---|---|---|---|---|---|---|---|---|---|---|---|---|
| | 70 | 80 | 90 | 100 | 110 | 125 | 150 | 175 | 200 | 225 | 250 | 275 |
| sapphire (Experiment 1) | A | A | A | A | A | A | A | A | A | A | B | F |
| silicon (Experiment 2) | A | A | A | A | A | A | A | A | A | B | — | — |
| silicon with oxide film (Experiment 3) | A | A | A | A | A | A | A | A | A | B | — | — |
| glass (Experiment 4) | A | A | A | A | A | B | — | — | — | — | — | — |

A lithium tantalate wafer was used in Experiments 1 to 4. When experiments were carried out in the same manner as in Experiments 1 to 4 except that a lithium niobate wafer was used as the oxide single-crystal wafer, the same results as those in Table 1 were obtained. When experiments were carried out in the same manner as in Experiments 1 to 4 except that ozone water treatment, UV ozone treatment, or vacuum ion beam treatment was used instead of the plasma treatment as the surface activation treatment, exactly same results were obtained. It is evident from those results that any of the above-described activation methods is effective, and there is no difference in the results between lithium tantalate and lithium niobate.

Example 1

A sapphire wafer having a diameter of 100 mm and a thickness of 0.35 mm was used as the support wafer, while a lithium tantalate wafer having a diameter of 100 mm and a thickness of 0.35 mm was used as the oxide single-crystal wafer. Each of the surface of the sapphire wafer and the surface of the lithium tantalate wafer to be bonded together had a surface roughness RMS of 1.0 nm or less.

First, an ion-implanted layer was formed inside the lithium tantalate wafer by implanting hydrogen atom ions from the surface of the lithium tantalate wafer under the following conditions: an implantation dose of $7.0 \times 10^{16}$ atom/cm$^2$ and an accelerating voltage of 100 KeV. Next, the surface of the lithium tantalate wafer from which the ions had been implanted and the surface of the sapphire wafer to be laminated with the lithium tantalate wafer were activated by vacuum ion beam treatment with a vacuum ion beam apparatus under $7 \times 10^{-6}$ Pa while using Ar as an ion source. Next, the activated surfaces of the sapphire wafer and the lithium tantalate wafer were bonded together at room temperature (25° C.) to obtain each laminate. Next, each laminate thus obtained was heated to a temperature of 90, 100, 110, 125, 150, 175, 200, or 225° C., and heat-treated at the temperature for 24 hours. A heat treatment oven was used as a heater, and the atmospheric temperature in the oven was measured as the temperature of each laminate by using a thermocouple. The heat-treated laminate was allowed to stand until the temperature decreased to room temperature. Then, at room temperature (25° C.), each laminate was exposed to visible light from the lithium tantalate wafer side thereof by using a flash lamp annealer. Then, it was split along the ion-implanted layer and each composite wafer having a lithium tantalate film transferred onto the sapphire wafer was obtained. The result of the appearance inspection of each composite wafer thus obtained is shown in Table 2. This appearance inspection was performed visually. A composite wafer having a film transferred onto the entire surface of the support wafer was evaluated as "A", a composite wafer having a film partially transferred onto the surface of the support wafer was evaluated as "B", and a composite wafer not formed due to failure of film transfer was evaluated as "F".

Comparative Example 1

A composite wafer was obtained in the same manner as in Example 1 except that the laminate was heat-treated at 70° C. for 24 hours. The result of the appearance inspection of the composite wafer thus obtained is shown in Table 2.

Comparative Example 2

A composite wafer was obtained in the same manner as in Example 1 except that the laminate was heat-treated at 80° C. for 24 hours. The result of the appearance inspection of the composite wafer thus obtained is shown in Table 2.

Example 2

Each composite wafer was obtained in the same manner as in Example 1 except that a silicon wafer having a diameter of 100 mm and a thickness of 0.35 mm was used as the support wafer, and each laminate thus obtained was heated to a temperature of 90, 100, 110, 125, 150, 175, or 200° C., and heat-treated at the temperature for 24 hours. Each of the surface of the silicon wafer and the surface of the lithium tantalate wafer to be bonded together had a surface roughness RMS of 1.0 nm or less. The result of the appearance inspection of each composite wafer thus obtained is shown in Table 2.

Comparative Example 3

A composite wafer was obtained in the same manner as in Example 2 except that the laminate was heat-treated at 70° C. for 24 hours. The result of the appearance inspection of the composite wafer thus obtained is shown in Table 2.

Comparative Example 4

A composite wafer was obtained in the same manner as in Example 2 except that the laminate was heat-treated at 80° C. for 24 hours. The result of the appearance inspection of the composite wafer thus obtained is shown in Table 2.

Example 3

Each composite wafer was obtained in the same manner as in Example 1 except that a silicon wafer with an oxide film containing a silicon wafer having a diameter of 100 mm and a thickness of 0.35 mm and a 100-nm oxide film on the silicon wafer was used as the support wafer, and each laminate thus obtained was heated to a temperature of 90, 100, 110, 125, 150, 175, or 200° C., and heat-treated a the temperature for 24 hours. Each of the surface of the silicon wafer with an oxide film and the surface of the lithium tantalate wafer to be bonded together had a surface roughness RMS of 1.0 nm or less. The result of the appearance inspection of each composite wafer thus obtained is shown in Table 2. The silicon wafer with an oxide film was obtained by heat-treating a silicon wafer at 1100° C. for about one hour to allow a 100-nm thermal oxide film to grow on the silicon wafer.

Comparative Example 5

A composite wafer was obtained in the same manner as in Example 3 except that the laminate was heat-treated at 70° C. for 24 hours. The result of the appearance inspection of the composite wafer thus obtained is shown in Table 2.

Comparative Example 6

A composite wafer was obtained in the same manner as in Example 3 except that the laminate was heat-treated at 80° C. for 24 hours. The result of the appearance inspection of the composite wafer thus obtained is shown in Table 2.

Example 4

Each composite wafer was obtained in the same manner as in Example 1 except that a glass wafer having a diameter of 100 mm and a thickness of 0.35 mm was used as the support wafer, each laminate thus obtained was heated to a temperature of 90, 100, or 110° C., and heat-treated at the temperature for 24 hours. Each of the surface of the glass wafer and the surface of the lithium tantalate wafer to be bonded together had a surface roughness RMS of 1.0 nm or less. The result of the appearance inspection of each composite wafer thus obtained is shown in Table 2.

Comparative Example 7

A composite wafer was obtained in the same manner as in Example 4 except that the laminate was heat-treated at 70° C. for 24 hours. The result of the appearance inspection of the composite wafer thus obtained is shown in Table 2.

Comparative Example 8

A composite wafer was obtained in the same manner as in Example 4 except that the laminate was heat-treated at 80° C. for 24 hours. The result of the appearance inspection of the composite wafer thus obtained is shown in Table 2.

TABLE 2

| kind of support wafer | temperature (° C.) of laminate during heat treatment | | | | | | | | | | |
| --- | --- | --- | --- | --- | --- | --- | --- | --- | --- | --- | --- |
| | 70 | 80 | 90 | 100 | 110 | 125 | 150 | 175 | 200 | 225 | 250 |
| sapphire (Example 1 and Comp. Exs. 1-2) | F | B | A | A | A | A | A | A | A | A | — |
| silicon (Example 2 and Comp. Exs. 3-4) | F | B | A | A | A | A | A | A | A | — | — |
| silicon with oxide film (Example 3 and Comp. Exs. 5-6) | F | B | A | A | A | A | A | A | A | — | — |
| glass (Example 4 and Comp. Exs. 7-8) | F | B | A | A | A | — | — | — | — | — | — |

Regarding the composite wafer samples obtained by using a sapphire wafer as the support wafer and the heat treatment at 90 to 225° C., the composite wafer samples obtained by using a silicon wafer as the support wafer and the heat treatment at 90 to 200° C., the composite wafer samples obtained by using a silicon wafer with an oxide film as the support wafer and the heat treatment temperature at from 90 to 200° C., and the composite wafer samples obtained by using a glass wafer as the support wafer and the heat treatment at 90 to 110° C., it is confirmed that each lithium tantalate film was transferred onto the entire surface of each support wafer as shown in Table 2.

In any of the support wafers, when the heat treatment temperature was 70° C., there was no split along the ion-implanted layer and peeling occurred at the interface between the two wafers laminated together. When the heat treatment temperature was 80° C., there appeared two regions on the support wafer, that is, an area where a lithium tantalate film was transferred and an area where the film was not transferred. It is considered that the film was not transferred onto the entire surface because at 70° C. and 80° C., embrittlement at the ion implantation interface was not sufficient and a lamination force between the two wafers was not enough.

When experiments were carried out in the same manner as in Examples 1 to 4 except that a lithium niobate wafer was used as the oxide single-crystal wafer, the same results as those shown in Table 2 were obtained. When experiments were carried out in the same manner as in Examples 1 to 4 except that ozone water treatment, UV ozone treatment, or plasma treatment was used instead of the vacuum ion beam treatment as the surface activation treatment, the same results were obtained. Further, when experiments were carried out in the same manner as in Examples 1 to 4 except that a laser was used instead of the flash lamp annealer as the exposition to visible light, the same results were obtained. As a laser light source, a green laser having a wavelength of 532 nm, which is typically used for crystallization of amorphous silicon for liquid crystal, was used. The green laser may be replaced by the second harmonic (wavelength: 532 nm) of a Nd:YAG laser, the second harmonic (wavelength: 532 nm) of a YVO$_4$ laser, an argon laser (wavelength: 514 nm) or the like.

Example 5

Each composite wafer was obtained in the same manner as in Example 1 except that each laminate was exposed to visible light from the lithium tantalate wafer side thereof by using a flash lamp annealer, while keeping a wedge-like sharp blade in contact with the ion-implanted layer of the laminate cooled to room temperature after the heat treatment, in the lightly pressed state of the blade by a spring provided on the side opposite to the blade kept in contact with the laminate. The result of the appearance inspection of each composite wafer thus obtained is shown in Table 3. This appearance inspection shown in Table 3 was performed visually. A composite wafer having a film transferred onto the entire surface of the support wafer was evaluated as "A", a composite wafer having a film partially transferred onto the surface of the support wafer was evaluated as "B", and a composite wafer not formed due to failure of film transfer was evaluated as "F".

Comparative Examples 9 and 10

Each composite wafer was obtained in the same manner as in Comparative Example 1 or 2 except that each laminate was exposed to visible light from the lithium tantalate wafer side thereof by using a flash lamp annealer, while keeping a wedge-like sharp blade in contact with the ion-implanted layer of the laminate cooled to room temperature after the heat treatment, in the lightly pressed state of the blade by a spring provided on the side opposite to the blade kept in contact with the laminate. The result of the appearance inspection of each composite wafer thus obtained is shown in Table 3.

Example 6

Each composite wafer was obtained in the same manner as in Example 2 except that each laminate was exposed to visible light from the lithium tantalate wafer side thereof by using a flash lamp annealer, while keeping a wedge-like sharp blade in contact with the ion-implanted layer of the laminate cooled to room temperature after the heat treatment, in the lightly pressed state of the blade by a spring provided on the side opposite to the blade kept in contact with the laminate. The result of the appearance inspection of each composite wafer thus obtained is shown in Table 3.

Comparative Examples 11 and 12

Each composite wafer was obtained in the same manner as in Comparative Example 3 or 4 except that each laminate was exposed to visible light from the lithium tantalate wafer side thereof by using a flash lamp annealer, while keeping a wedge-like sharp blade in contact with the ion-implanted layer of the laminate cooled to room temperature after the heat treatment, in the lightly pressed state of the blade by a spring provided on the side opposite to the blade kept in contact with the laminate. The result of the appearance inspection of each composite wafer thus obtained is shown in Table 3.

Example 7

Each composite wafer was obtained in the same manner as in Example 3 except that each laminate was exposed to visible light from the lithium tantalate wafer side thereof by using a flash lamp annealer, while keeping a wedge-like sharp blade in contact with the ion-implanted layer of the laminate cooled to room temperature after the heat treatment, in the lightly pressed state of the blade by a spring provided on the side opposite to the blade kept in contact with the laminate. The result of the appearance inspection of each composite wafer thus obtained is shown in Table 3.

Comparative Examples 13 and 14

Each composite wafer was obtained in the same manner as in Comparative Example 5 or 6 except that each laminate was exposed to visible light from the lithium tantalate wafer side thereof by using a flash lamp annealer, while keeping a wedge-like sharp blade in contact with the ion-implanted layer of the laminate cooled to room temperature after the heat treatment, in the lightly pressed state of the blade by a spring provided on the side opposite to the blade kept in contact with the laminate. The result of the appearance inspection of each composite wafer thus obtained is shown in Table 3.

Example 8

Each composite wafer was obtained in the same manner as in Example 4 except that each laminate was exposed to visible light from the lithium tantalate wafer side thereof by using a flash lamp annealer, while keeping a wedge-like sharp blade in contact with the ion-implanted layer of the laminate cooled to room temperature after the heat treatment, in the lightly pressed state of the blade by a spring provided on the side opposite to the blade kept in contact with the laminate. The result of the appearance inspection of each composite wafer thus obtained is shown in Table 3.

Comparative Examples 15 and 16

Each composite wafer was obtained in the same manner as in Comparative Example 7 or 8 except that each laminate was exposed to visible light from the lithium tantalate wafer side thereof by using a flash lamp annealer, while keeping a wedge-like sharp blade in contact with the ion-implanted layer of the laminate cooled to room temperature after the heat treatment, in the lightly pressed state of the blade by a spring provided on the side opposite to the blade kept contact with the laminate. The result of the appearance inspection of each composite wafer thus obtained is shown in Table 3.

TABLE 3

| kind of support wafer | temperature (° C.) of laminate during heat treatment | | | | | | | | | | |
|---|---|---|---|---|---|---|---|---|---|---|---|
| | 70 | 80 | 90 | 100 | 110 | 125 | 150 | 175 | 200 | 225 | 250 |
| sapphire (Example 5 and Comp. Exs. 9-10) | F | B | A | A | A | A | A | A | A | A | — |
| silicon (Example 6 and Comp. Exs. 11-12) | F | B | A | A | A | A | A | A | A | — | — |
| silicon with oxide film (Example 7 and Comp. Exs. 13-14) | F | B | A | A | A | A | A | A | A | — | — |
| glass (Example 8 and Comp. Exs. 15-16) | F | B | A | A | A | — | — | — | — | — | — |

Regarding composite wafer samples obtained by using a sapphire wafer as the support wafer and the heat treatment at 90 to 225° C., composite wafer samples obtained by using a silicon wafer as the support wafer and the heat treatment temperature at 90 to 200° C., composite wafer samples obtained by using a silicon wafer with an oxide film as the support wafer and the heat treatment at 90 to 200° C., and composite wafer samples obtained by using a glass wafer as the support wafer and the heat treatment at from 70 to 110° C., it is confirmed that as shown in Table 3, a lithium tantalate film was transferred onto the entire surface of the support wafer. It is evident from the results that splitting by using optical energy produced by exposition to light and physical energy produced by mechanical impact improves handling properties during the transfer.

Example 9

Each composite wafer was obtained in the same manner as in Example 1 except that an ion-implanted layer was formed inside the lithium tantalate wafer by implanting hydrogen atom ions from the surface of the lithium tantalate wafer under the following conditions: an implantation dose of $5.0 \times 10^{16}$, $7.5 \times 10^{16}$, $10 \times 10^{16}$, $12.5 \times 10^{16}$, $15 \times 10^{16}$, $17.5 \times 10^{16}$, $20 \times 10^{16}$, $22.5 \times 10^{16}$, $25 \times 10^{16}$, or $27.5 \times 10^{16}$ atom/cm$^2$, and an accelerating voltage of 100 KeV, and each laminate thus obtained was heat-treated at 90° C. for 24 hours.

Comparative Example 17

A composite wafer was obtained in the same manner as in Example 9 except that an ion-implanted layer was formed inside the lithium tantalate wafer by implanting hydrogen atom ions from the surface of the lithium tantalate wafer under the following conditions: an implantation dose of $4.0 \times 10^{16}$ atom/cm$^2$ and an accelerating voltage of 100 KeV.

Reference Example 1

A lithium tantalate wafer having a diameter of 100 mm and a thickness of 0.35 mm was used as the oxide single-crystal wafer. The surface of the lithium tantalate wafer to be bonded had a surface roughness RMS of 1.0 nm or less. An ion-implanted layer was formed inside the lithium tantalate wafer by implanting hydrogen atom ions from the surface of the lithium tantalate wafer under the following conditions: an implantation dose of $30 \times 10^{16}$ atom/cm$^2$ and an accelerating voltage of 100 KeV. As a result, a surface of the lithium tantalate wafer before lamination was found to have unevenness, which was not a surface roughness required for the lamination so that it was not laminated. The unevenness on the surface of the lithium tantalate wafer is presumed to occur because the implanted hydrogen failed to become dissolved and foamed inside the wafer.

Example 10

Each composite wafer was obtained in the same manner as in Example 2 except that an ion-implanted layer was formed inside the lithium tantalate wafer by implanting hydrogen atom ions from the surface of the lithium tantalate wafer under the following conditions: an implantation dose of $5.0 \times 10^{16}$, $7.5 \times 10^{16}$, $10 \times 10^{16}$, $12.5 \times 10^{16}$, $15 \times 10^{16}$, $17.5 \times 10^{16}$, $20 \times 10^{16}$, $22.5 \times 10^{16}$, $25 \times 10^{16}$, or $27.5 \times 10^{16}$ atom/cm$^2$, and an accelerating voltage of 100 KeV, and each laminate thus obtained was heat-treated at 90° C. for 24 hours.

Comparative Example 18

A composite wafer was obtained in the same manner as in Example 10 except that an ion-implanted layer was formed inside the lithium tantalate wafer by implanting hydrogen atom ions from the surface of the lithium tantalate wafer under the following conditions: an implantation dose of $4.0 \times 10^{16}$ atom/cm$^2$ and an accelerating voltage of 100 KeV.

Example 11

Each composite wafer was obtained in the same manner as in Example 3 except that an ion-implanted layer was formed inside the lithium tantalate wafer by implanting hydrogen atom ions from the surface of the lithium tantalate wafer under the following conditions: an implantation dose of $5.0 \times 10^{16}$, $7.5 \times 10^{16}$, $10 \times 10^{16}$, $12.5 \times 10^{16}$, $15 \times 10^{16}$, $17.5 \times 10^{16}$, $20 \times 10^{16}$, $22.5 \times 10^{16}$, $25 \times 10^{16}$, or $27.5 \times 10^{16}$ atom/cm$^2$, and an accelerating voltage of 100 KeV, and each laminate thus obtained was heat-treated at 90° C. for 24 hours.

Comparative Example 19

A composite wafer was obtained in the same manner as in Example 11 except that an ion-implanted layer was formed inside the lithium tantalate wafer by implanting hydrogen atom ions from the surface of the lithium tantalate wafer under the following conditions: an implantation dose of $4.0 \times 10^{16}$ atom/cm$^2$ and an accelerating voltage of 100 KeV.

Example 12

Each composite wafer was obtained in the same manner as in Example 4 except that an ion-implanted layer was formed inside the lithium tantalate wafer by implanting hydrogen atom ions from the surface of the lithium tantalate wafer under the following conditions: an implantation dose of $5.0 \times 10^{16}$, $7.5 \times 10^{16}$, $10 \times 10^{16}$, $12.5 \times 10^{16}$, $15 \times 10^{16}$, $17.5 \times$ $10^{16}$, $20 \times 10^{16}$, $22.5 \times 10^{16}$, $25 \times 10^{16}$, or $27.5 \times 10^{16}$ atom/cm$^2$, and an accelerating voltage of 100 KeV, and each laminate thus obtained was heat-treated at 90° C. for 24 hours.

Comparative Example 20

A composite wafer was obtained in the same manner as in Example 12 except that an ion-implanted layer was formed inside the lithium tantalate wafer by implanting hydrogen atom ions from the surface of the lithium tantalate wafer under the following conditions: an implantation dose of $4.0 \times 10^{16}$ atom/cm$^2$ and an accelerating voltage of 100 KeV.

It is confirmed that in Examples 9 to 12 in which hydrogen atom ions were implanted at an implantation dose of from $5.0 \times 10^{16}$ to $27.5 \times 10^{16}$ atom/cm$^2$, a lithium tantalate film was transferred onto the entire surface of the support wafer irrespective of the kind of the support wafer. On the other hand, in Comparative Examples 17 to 20 in which hydrogen atom ions were implanted at an implantation dose of $4.0 \times 10^{16}$ atom/cm$^2$, there was no split along the ion-implanted layer of the lithium tantalate wafer irrespective of the kind of the support wafer. It is presumed that the ion implantation dose was insufficient so that sufficient embrittlement was not caused in the later step.

Hydrogen atom ions were used in Examples 9 to 12. The similar results were obtained when hydrogen molecule ions were used and the implantation dose of the hydrogen molecule ions was reduced to half of that of the hydrogen atom ions. Further, the results similar to those of Examples 9 to 12 were obtained when a lithium niobate wafer was used as the oxide single-crystal wafer.

Example 13

A composite wafer was obtained in the same manner as in Example 1 except that the laminate was heat-treated at 110° C. for 24 hours and after the heat treatment, it was cooled to room temperature and exposed to visible light from the support wafer side thereof by using a flash lamp annealer. When a sapphire wafer was used as the support wafer, even exposition of the laminate to visible light from the support wafer side enabled the transfer of a lithium tantalate film on the entire surface of the sapphire wafer. The same result was obtained by using a lithium niobate wafer in place of the lithium tantalate wafer.

Example 14

A composite wafers was obtained in the same manner as in Example 13 except for use of a glass wafer as the support wafer. When a glass wafer was used as the support wafer, even exposition of the laminate to visible light from the support wafer side enabled the transfer of a lithium tantalate film on the entire surface of the glass wafer. The same result was obtained by using a lithium niobate wafer in place of the lithium tantalate wafer.

Examples 15

Each composite wafer was obtained in the same manner as in Example 1 except that each laminate was heat-treated at 1100° C. for 24 hours; each laminate cooled to room temperature after the heat treatment was exposed to visible light from the lithium tantalate wafer side thereof by using a flash lamp annealer, while placing the support wafer-side surface of the laminate on a hot plate whose surface temperature was 20, 25, 35, 45, 55, 65, 75, 85, 95, 105, or 115° C.; and each laminate was taken out from the hot plate just after the exposition to visible light. The surface temperature of the hot plate was measured using a thermocouple, and was used as the temperature of each laminate during the exposition to visible light. The result of the appearance inspection of each composite wafer thus obtained is shown in Table 4. The appearance inspection was performed visually. A composite wafer having a film transferred onto the entire surface of the support wafer was evaluated as "A", a composite wafer having a film partially transferred onto the surface of the support wafer was evaluated as "B", and a composite wafer not formed due to failure of film transfer or a broken composite wafer was evaluated as "F".

Comparative Example 21

A composite wafer was obtained in the same manner as in Example 15 except that the laminate was exposed to visible light, while placing the support wafer-side surface of the laminate on a hot plate whose surface temperature was 125° C. The result of the appearance inspection of the composite wafer thus obtained is shown in Table 4.

Example 16

Each composite wafer was obtained in the same manner as in Example 2 except that each laminate were heat-treated at 110° C. for 24 hours; each laminate cooled to room temperature after the heat treatment was exposed to visible light from the lithium tantalate wafer side thereof by using a flash lamp annealer, while placing the support wafer-side surface of the laminate on a hot plate whose surface temperature was 20, 25, 35, 45, 55, 65, 75, 85, 95, or 105; and each laminate was taken out from the hot plate just after the exposition to visible light. The result of the appearance inspection of each composite wafer thus obtained is shown in Table 4.

Comparative Example 22

A composite wafer was obtained in the same manner as in Example 16 except that when the laminate was exposed to a visible light, while placing the support wafer-side surface of the laminate on a hot plate whose surface temperature was 115° C. The result of the appearance inspection of the composite wafer thus obtained is shown in Table 4.

Example 17

Each composite wafer was obtained in the same manner as in Example 3 except that each laminate was heat-treated at 110° C. for 24 hours; each laminate cooled to room temperature after the heat treatment was exposed to visible light from the lithium tantalate wafer side thereof by using a flash lamp annealer, while placing the support wafer-side surface of the laminate on a hot plate whose surface temperature was 20, 25, 35, 45, 55, 65, 75, 85, 95, or 105; and each laminate was taken out from the hot plate just after the exposition to visible light. The result of the appearance inspection of each composite wafer thus obtained is shown in Table 4.

Comparative Example 23

A composite wafer was obtained in the same manner as in Example 17 except that the laminate was exposed to visible light, while placing the support wafer-side surface of the laminate on a hot plate whose surface temperature was 115° C. The result of the appearance inspection of the composite wafer thus obtained is shown in Table 4.

Example 18

Each composite wafer was obtained in the same manner as in Example 4 except that each laminate was heat-treated at 110° C. for 24 hours; each laminate cooled to room temperature after the heat treatment was exposed to visible light from the lithium tantalate wafer side thereof by using a flash lamp annealer, while placing the support wafer-side surface of the laminate on a hot plate whose surface temperature was 20, 25, 35, 45, 55, and 65; and each laminate was taken out from the hot plate just after the exposition to visible light. The result of the appearance inspection of each composite wafer thus obtained is shown in Table 4.

Comparative Example 24

A composite wafer was obtained in the same manner as in Example 18 except that the laminate was exposed to visible light, while placing the support wafer-side surface of the laminate on a hot plate whose surface temperature was 75° C. The result of the appearance inspection of the composite wafer thus obtained is shown in Table 4.

TABLE 4

| kind of support wafer | temperature (° C.) of laminate during exposition to light | | | | | | | | | | | |
|---|---|---|---|---|---|---|---|---|---|---|---|---|
| | 20 | 25 | 35 | 45 | 55 | 65 | 75 | 85 | 95 | 105 | 115 | 125 |
| sapphire (Example 15 and Comp. Ex. 21) | A | A | A | A | A | A | A | A | A | A | A | F |
| silicon (Example 16 and Comp. Ex. 22) | A | A | A | A | A | A | A | A | A | A | F | — |
| silicon with oxide film (Example 17 and Comp. Ex. 23) | A | A | A | A | A | A | A | A | A | A | F | — |
| glass (Example 18 and Comp. Ex. 24) | A | A | A | A | A | A | F | — | — | — | — | — |

It is confirmed that as shown in Table 4, a composite wafer can be produced by making the difference between the temperature of the laminate during the exposition and the temperature at the bonding (i.e. laminating) to fall within the predetermined range. More specifically, it is confirmed that a lithium tantalate film can be transferred onto the entire surface of the support wafer without causing cracking of the wafer by selecting the difference between the temperature (25° C.) in the step of laminating to obtain a laminate and the temperature of the laminate in the step of exposing the laminate to visible light for transferring the film to be 90° C. or less when the support wafer is a sapphire wafer, 80° C. or less when the support wafer is a silicon wafer or a silicon wafer with an oxide film, or 40° C. or less when the support wafer is a glass wafer.

EXPLANATION OF SYMBOLS

11: oxide single-crystal wafer
11s: surface of oxide single-crystal wafer
11a: oxide single-crystal film
11b: a portion of oxide single-crystal wafer after split
12: hydrogen ion
13: ion-implanted layer
14: support wafer
14s: surface of support wafer
15: ion beam for exposition
16: laminate
17: light for exposition
18: composite wafer

The invention claimed is:

1. A method of producing a composite wafer having an oxide single-crystal film on a support wafer, comprising steps of:
   implanting hydrogen atom ions or hydrogen molecule ions into an oxide single-crystal wafer through a surface thereof, which wafer is a lithium tantalate or lithium niobate wafer, to form an ion-implanted layer inside the oxide single-crystal wafer;
   subjecting at least one of the surface of the oxide single-crystal wafer and a surface of a support wafer to be laminated with the oxide single-crystal wafer to surface activation treatment;
   after the surface activation treatment, bonding the surface of the oxide single-crystal wafer to the surface of the support wafer at a temperature of from 10° C. to 50° C. to obtain a laminate;
   heat-treating the laminate at a temperature of 90° C. or higher at which cracking is not caused; and
   exposing the heat-treated laminate to visible light to split the laminate along the ion-implanted layer to obtain an oxide single-crystal film transferred onto the support wafer;
   wherein
      an implantation dose of the hydrogen atom ions is from $5.0 \times 10^{16}$ atom/cm$^2$ to $2.75 \times 10^{17}$ atom/cm$^2$ and an implantation dose of the hydrogen molecule ions is from $2.5 \times 10^{16}$ atoms/cm$^2$ to $1.37 \times 10^{17}$ atoms/cm$^2$;
      the support wafer is a glass wafer;
      a difference between a temperature at the bonding to obtain the laminate and a temperature of the laminate during the exposition to the visible light is 40° C. or less; and
      the temperature in the step of heat-treating is from 90 to 110° C.

2. The method of producing a composite wafer according to claim 1, wherein the step of exposition comprises exposing the laminate to the visible light while bringing a wedge-like blade into contact with the ion-implanted layer of the laminate.

3. The method of producing a composite wafer according to claim 1, wherein the surface activation treatment is selected from the group consisting of ozone water treatment, UV ozone treatment, ion beam treatment, and plasma treatment.

4. The method of producing a composite wafer according to claim 1, wherein a source of the visible light is a flash lamp of a flash lamp annealer.

5. The method of producing a composite wafer according to claim 1, wherein the source of the visible light is a laser light source.

6. The method of producing a composite wafer according to claim 1, wherein the step of exposition comprises exposing the laminate to the visible light from an oxide single-crystal wafer side thereof.

7. The method of producing a composite wafer according to claim 1, wherein the step of exposition comprises exposing the laminate to the visible light from a support wafer side.

* * * * *